(12) United States Patent
Ninomiya et al.

(10) Patent No.: US 11,699,569 B2
(45) Date of Patent: Jul. 11, 2023

(54) ION IMPLANTER AND PARTICLE DETECTION METHOD

(71) Applicant: SUMITOMO HEAVY INDUSTRIES ION TECHNOLOGY CO., LTD., Tokyo (JP)

(72) Inventors: Aki Ninomiya, Ehime (JP); Takanori Yagita, Ehime (JP); Takao Morita, Ehime (JP); Sayumi Hirose, Kanagawa (JP)

(73) Assignee: SUMITOMO HEAVY INDUSTRIES ION TECHNOLOGY CO., LTD., Tokyo (JP)

(*) Notice: Subject to any disclaimer, the term of this patent is extended or adjusted under 35 U.S.C. 154(b) by 96 days.

(21) Appl. No.: 17/483,293

(22) Filed: Sep. 23, 2021

(65) Prior Publication Data

US 2022/0102112 A1 Mar. 31, 2022

(30) Foreign Application Priority Data

Sep. 25, 2020 (JP) ................. 2020-160485

(51) Int. Cl.
 *H01J 37/317* (2006.01)
 *H01J 37/22* (2006.01)
 *H01J 37/304* (2006.01)
(52) U.S. Cl.
 CPC ........ *H01J 37/3171* (2013.01); *H01J 37/222* (2013.01); *H01J 37/304* (2013.01); *H01J 2237/20207* (2013.01)

(58) Field of Classification Search
 CPC .... H01J 37/3171; H01J 37/222; H01J 37/304; H01J 2237/0225; H01J 2237/20207; H01J 2237/31705
 See application file for complete search history.

(56) References Cited

U.S. PATENT DOCUMENTS

| 4,804,853 A | 2/1989 | Borden et al. |
| 6,115,120 A | 9/2000 | Moriya et al. |
| 7,235,795 B2 | 6/2007 | Simmons |
| 7,937,178 B2 | 5/2011 | Moriya |

(Continued)

FOREIGN PATENT DOCUMENTS

| JP | 2000-040670 A | 2/2000 |
| JP | 3148187 B2 | 1/2001 |

(Continued)

*Primary Examiner* — David E Smith
*Assistant Examiner* — Hsien C Tsai
(74) *Attorney, Agent, or Firm* — Michael Best & Friedrich LLP

(57) ABSTRACT

There is provided an ion implanter including a beamline unit that transports an ion beam, an implantation processing chamber in which an implantation process of irradiating a wafer with an ion beam is performed, an illumination device that performs irradiation with illumination light in a direction intersecting with a transport direction of the ion beam in at least one of the beamline unit and the implantation processing chamber, an imaging device that generates a captured image captured by imaging a space through which the illumination light passes, and a control device that detects a particle which scatters the illumination light, based on the captured image.

20 Claims, 6 Drawing Sheets

(56) References Cited

U.S. PATENT DOCUMENTS

2001/0016430 A1*   8/2001   Nakano ............ H01J 37/32935
                                                    438/771
2006/0035396 A1*   2/2006   Simmons ............ H01J 37/3171
                                                    438/514

FOREIGN PATENT DOCUMENTS

JP         2008-510295 A    4/2008
JP           4864608 B2    11/2011

* cited by examiner

ION IMPLANTER AND PARTICLE DETECTION METHOD

RELATED APPLICATIONS

The content of Japanese Patent Application No. 2020-160485, on the basis of which priority benefits are claimed in an accompanying application data sheet, is in its entirety incorporated herein by reference.

BACKGROUND

Technical Field

Certain embodiments of the present invention relate to an ion implanter and a particle detection method.

Description of Related Art

In a semiconductor manufacturing process, a process of implanting ions into a semiconductor wafer (also referred to as an ion implantation process) is generally performed in order to change conductivity of a semiconductor, in order to change a crystal structure of the semiconductor, and so on. In the ion implantation process, an ion implanter that transports an ion beam along a beamline extending toward the semiconductor wafer serving as an implantation target is adopted.

In some cases, due to various factors, particles (contamination particles) may be generated inside a vacuum chamber in which the ion beam is transported. When the particles are transported toward the wafer together with the ion beam, there is a possibility that the particles may affect the ion implantation process performed on the semiconductor wafer. Therefore, there is known an apparatus that irradiates a laser beam toward the beamline, measures intensity of light scattered by the contamination particles, and analyzes a flux of the contamination particles.

SUMMARY

According to an aspect of the present invention, there is provided an ion implanter including a beamline unit that transports an ion beam, an implantation processing chamber in which an implantation process of irradiating a wafer with an ion beam is performed, an illumination device that performs irradiation with illumination light in a direction intersecting with a transport direction of the ion beam in at least one of the beamline unit and the implantation processing chamber, an imaging device that generates a captured image captured by imaging a space through which the illumination light passes, and a control device that detects a particle which scatters the illumination light, based on the captured image.

According to another aspect of the present invention, there is provided a particle detection method. The method includes performing irradiation with illumination light in a direction intersecting with a transport direction of an ion beam, generating a captured image captured by imaging a space through which the illumination light passes, and detecting a particle which scatters the illumination light, based on the captured image.

DETAILED DESCRIPTION

Figure 1:
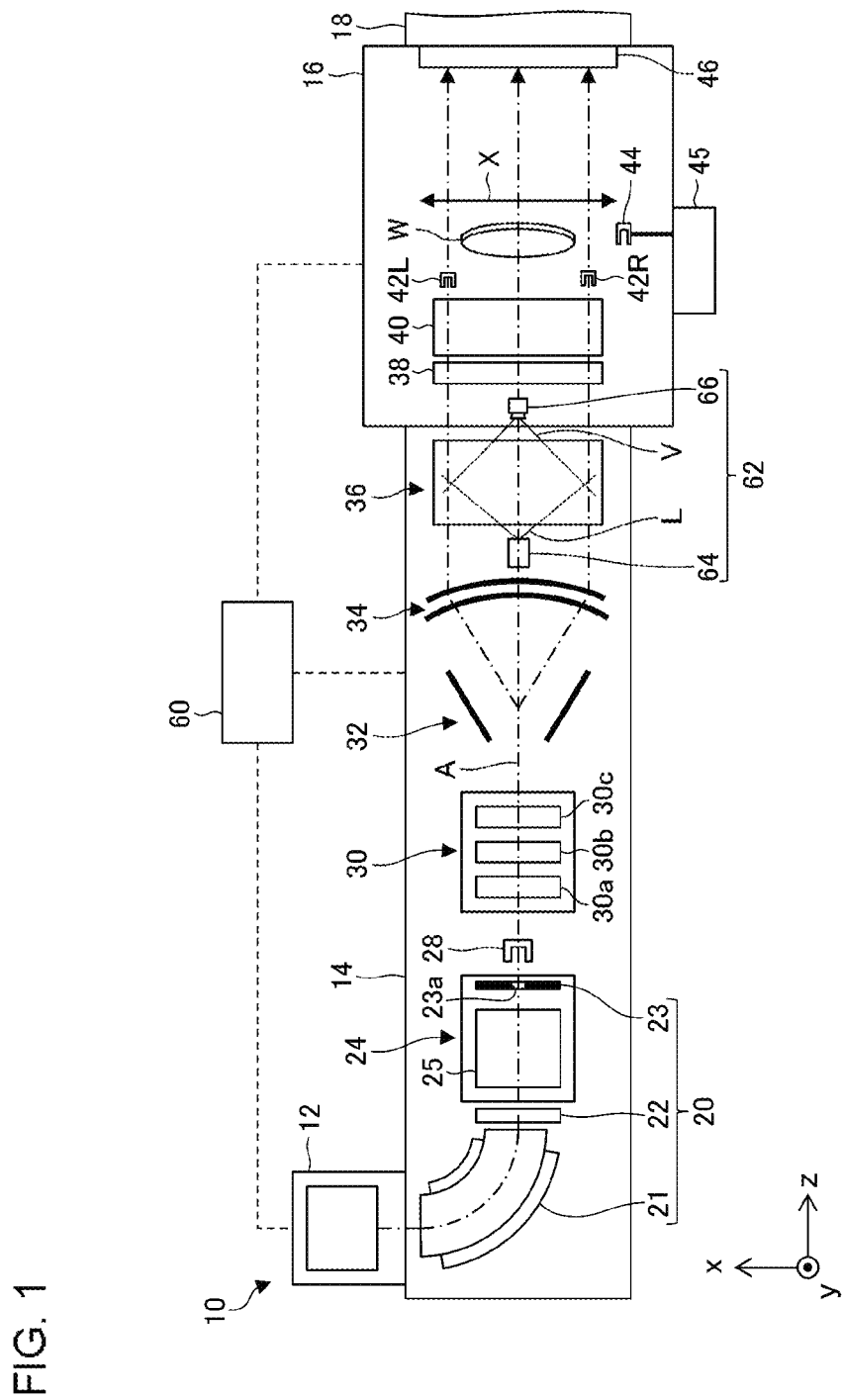
FIG. 1 is a top view illustrating a schematic configuration of an ion implanter according to an embodiment.

In some cases, inside a vacuum chamber in which an ion beam is transported, a light emission phenomenon may occur due to an interaction between residual gas inside the vacuum chamber and the ion beam. In this case, the light emission phenomenon may affect accuracy in detecting particles using scattered light.

It is desirable to provide a technique for improving accuracy in detecting particles transported together with an ion beam.

Any desired combination of the above-described components, and those in which the components or expressions according to the present invention are substituted from each other in methods, devices, or systems are effectively applicable as an aspect of the present invention.

According to an aspect of the present invention, accuracy in detecting particles transported together with an ion beam can be improved.

Hereinafter, embodiments according to the present invention will be described in detail with reference to the drawings. In describing the drawings, the same reference numerals will be assigned to the same elements, and repeated description will be appropriately omitted. Configurations described below are merely examples, and do not limit the scope of the present invention in any way.

Figure 2:
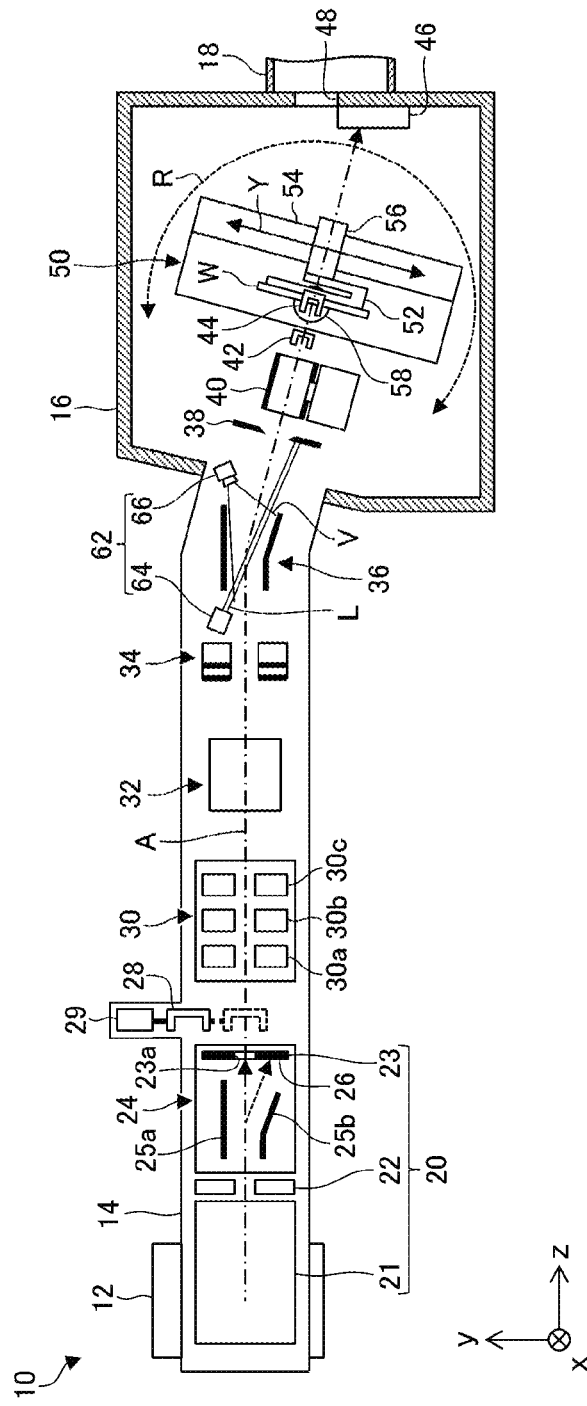
FIG. 2 is a side view illustrating a schematic configuration of the ion implanter in FIG. 1.

FIG. 1 is a top view schematically illustrating an ion implanter 10 according to an embodiment, and FIG. 2 is a side view illustrating a schematic configuration of the ion implanter 10. The ion implanter 10 is configured to perform an ion implantation process on a surface of a workpiece W. For example, the workpiece W is a substrate, and is a semiconductor wafer. For convenience of specification, the workpiece W may be referred to as a wafer W in the description herein. However, this is not intended to limit an implantation processing target to a specific object.

The ion implanter 10 is configured to irradiate a whole processing surface of the wafer W with the ion beam by performing reciprocating scanning using the beam in one direction and by causing the wafer W to reciprocate in a direction perpendicular to the scanning direction. In the specification herein, for convenience of description, a traveling direction of the ion beam traveling along a designed beamline A is defined as a z-direction, and a plane perpendicular to the z-direction is defined as an xy-plane. When the workpiece W is scanned with the ion beam, the scanning direction of the beam is defined as an x-direction, and a direction perpendicular to the z-direction and the x-direction is defined as a y-direction. Therefore, the reciprocating scanning using the beam is performed in the x-direction, and a reciprocating motion of the wafer W is performed in the y-direction.

The ion implanter 10 includes an ion generation device 12, a beamline unit 14, an implantation processing chamber 16, and a wafer transfer device 18. The ion generation device 12 is configured to provide the ion beam for the beamline unit 14. The beamline unit 14 is configured to transport the ion beam from the ion generation device 12 to the implantation processing chamber 16. The implantation processing chamber 16 accommodates the wafer W serving as an implantation target, and an implantation process of irradiating the wafer W with the ion beam provided from the beamline unit 14 is performed in the implantation processing chamber 16. The wafer transfer device 18 is configured to load an unprocessed wafer before the implantation process into the implantation processing chamber 16, and unload a processed wafer after the implantation process from the implantation processing chamber 16.

The ion implanter 10 includes a vacuum exhaust system (not illustrated) for providing a desired vacuum environment for the ion generation device 12, the beamline unit 14, the implantation processing chamber 16, and the wafer transfer device 18. Depending on an operation of the vacuum exhaust system, an internal pressure (vacuum degree) of at least one of the beamline unit 14 and the implantation processing chamber 16 is changed. The internal pressure of at least one of the beamline unit 14 and the implantation processing chamber 16 is also changed by wafer transfer operation by the wafer transfer device 18 or gas introduction into the beamline unit 14 or the implantation processing chamber 16.

The beamline unit 14 includes a mass analyzing unit 20, a beam park device 24, a beam shaping unit 30, a beam scanning unit 32, a beam parallelizing unit 34, and an angular energy filter (AEF) 36, in order from an upstream side of the beamline A. The upstream side of the beamline A means a region closer to the ion generation device 12, and a downstream side of the beamline A means a region closer to the implantation processing chamber 16 (or a beam stopper 46).

The mass analyzing unit 20 is provided downstream of the ion generation device 12, and is configured to select a required ion species from the ion beam extracted from the ion generation device 12 by performing mass analyzing. The mass analyzing unit 20 has a mass analyzing magnet 21, a mass analyzing lens 22, and a mass resolving aperture 23.

The mass analyzing magnet 21 applies a magnetic field to the ion beam extracted from the ion generation device 12, and deflects the ion beam to travel in a specific path in accordance with a value of the mass-to-charge ratio $M=m/q$ (here, m is mass, and q is charge) of the ions. For example, the mass analyzing magnet 21 applies the magnetic field in the y-direction (−y-direction in FIGS. 1 and 2) to the ion beam so that the ion beam is deflected in the x-direction. Magnetic field intensity of the mass analyzing magnet 21 is adjusted so that the ion species having a desired mass-to-charge ratio M passes through the mass resolving aperture 23.

The mass analyzing lens 22 is provided downstream of the mass analyzing magnet 21, and is configured to adjust focusing/defocusing power for the ion beam. The mass analyzing lens 22 adjusts a focusing position of the ion beam passing through the mass resolving aperture 23 in a beam traveling direction (z-direction), and adjusts a mass resolution $M/dM$ of the mass analyzing unit 20. The mass analyzing lens 22 is not an essential component, and the mass analyzing unit 20 may not have the mass analyzing lens 22.

The mass resolving aperture 23 is provided downstream of the mass analyzing lens 22, and is provided at a position away from the mass analyzing lens 22. The mass resolving aperture 23 is configured so that a beam deflection direction (x-direction) by the mass analyzing magnet 21 coincides with a slit width direction, and has an opening 23a having a shape which is relatively short in the x-direction and relatively long in the y-direction.

The mass resolving aperture 23 may be configured so that the slit width is variable for adjusting the mass resolution. The mass resolving aperture 23 may be configured to include two blockade bodies that are movable in the slit width direction, and may be configured so that the slit width is adjustable by changing an interval between the two blockade bodies. The mass resolving aperture 23 may be configured so that the slit width is variable by selecting any one of a plurality of slits having different slit widths.

The beam park device 24 is configured to cause the ion beam to temporarily retreat from the beamline A and to temporarily block the ion beam directed to the implantation processing chamber 16 (or the wafer W) located downstream. The beam park device 24 can be disposed at any desired position in an intermediate portion of the beamline A. For example, the beam park device 24 can be disposed between the mass analyzing lens 22 and the mass resolving aperture 23. A prescribed distance is required between the mass analyzing lens 22 and the mass resolving aperture 23. Accordingly, the beam park device 24 is disposed between both of them. In this manner, a length of the beamline A can be shortened, compared to a case where the beam park device 24 is disposed at another position. Therefore, the whole ion implanter 10 can be reduced in size.

The beam park device 24 includes a pair of park electrodes 25 (25a and 25b) and a beam dump 26. The pair of park electrodes 25a and 25b faces each other across the beamline A, and faces in a direction (y-direction) perpendicular to the beam deflection direction (x-direction) of the mass analyzing magnet 21. The beam dump 26 is provided on the downstream side of the beamline A than the park electrodes 25a and 25b, and is provided away from the beamline A in a facing direction of the park electrodes 25a and 25b.

The first park electrode 25a is disposed on an upper side of the beamline A in a direction of gravity, and the second park electrode 25b is disposed on a lower side of the beamline A in the direction of gravity. The beam dump 26 is provided at a position away to the lower side of the beamline A in the direction of gravity, and is disposed on the lower side of the opening 23a of the mass resolving aperture 23 in the direction of gravity. For example, the beam dump 26 is configured to include a portion where the opening 23a of the mass resolving aperture 23 is not formed. The beam dump 26 may be configured to be separate from the mass resolving aperture 23.

The beam park device 24 deflects the ion beam by using an electric field applied between the pair of park electrodes 25a and 25b, and causes the ion beam to retreat from the beamline A. For example, a negative voltage is applied to the second park electrode 25b, based on a potential of the first park electrode 25a. In this manner, the ion beam is deflected downward from the beamline A in the direction of gravity, and is incident into the beam dump 26. In FIG. 2, a trajectory of the ion beam directed toward the beam dump 26 is indicated by a dashed line. The beam park device 24 causes the ion beam to pass toward the downstream side along the beamline A by setting the pair of park electrodes 25a and 25b to have the same potential. The beam park device 24 is configured to be operable by switching between a first mode in which the ion beam passes through toward the downstream side and a second mode in which the ion beam is incident into the beam dump 26.

An injector Faraday cup 28 is provided downstream of the mass resolving aperture 23. The injector Faraday cup 28 is configured to be movable into and out of the beamline A by an operation of an injector drive unit 29. The injector drive unit 29 moves the injector Faraday cup 28 in a direction (for example, the y-direction) perpendicular to an extending direction of the beamline A. When the injector Faraday cup 28 is disposed on the beamline A as illustrated by a dashed line in FIG. 2, the injector Faraday cup 28 blocks the ion beam directed toward the downstream side. On the other hand, as illustrated by a solid line in FIG. 2, when the injector Faraday cup 28 retreats from the beamline A, the blocking of the ion beam directed toward the downstream side is released.

The injector Faraday cup 28 is configured to measure a beam current of the ion beam subjected to mass analyzing by the mass analyzing unit 20. The injector Faraday cup 28 can measure a mass analyzing spectrum of the ion beam by measuring the beam current while changing the magnetic field intensity of the mass analyzing magnet 21. The mass resolution of the mass analyzing unit 20 can be calculated using the measured mass analyzing spectrum.

The beam shaping unit 30 includes a focusing/defocusing device such as a focusing/defocusing quadrupole lens (Q-lens), and is configured to shape the ion beam having passed through the mass analyzing unit 20 to have a desired cross-sectional shape. For example, the beam shaping unit 30 is configured to include an electric field type three-stage quadrupole lens (also referred to as a triplet Q-lens), which has three quadrupole lenses 30a, 30b, and 30c. The beam shaping unit 30 adopts the three lens devices 30a to 30c. Accordingly, the beam shaping unit 30 can adjust the ion beam to converge or diverge independently in the x-direction and the y-direction, respectively. The beam shaping unit 30 may include a magnetic field type lens device, or may include a lens device that shapes the beam by using both an electric field and a magnetic field.

The beam scanning unit 32 is a beam deflection device configured to provide reciprocating scanning using the beam and to perform scanning using the shaped ion beam in the x-direction. The beam scanning unit 32 has a scanning electrode pair facing in a beam scanning direction (x-direction). The scanning electrode pair is connected to a variable voltage power supply (not illustrated), and a voltage applied between the scanning electrode pair is periodically changed. In this manner, an electric field generated between the electrodes is changed so that the ion beam is deflected at various angles. As a result, a whole scanning range is scanned with the ion beam in the x-direction. In FIG. 1, the scanning direction and the scanning range of the ion beam are indicated by an arrow X, and a plurality of trajectories of the ion beam in the scanning range are indicated by one dot chain lines.

The beam parallelizing unit 34 is configured so that the traveling direction of the scanned ion beam becomes parallel to the trajectory of the designed beamline A. The beam parallelizing unit 34 has a plurality of arc-shaped parallelizing lens electrodes in which an ion beam passing slit is provided in a central portion in the y-direction. The parallelizing lens electrode is connected to a high-voltage power supply (not illustrated), and applies an electric field generated by voltage application to the ion beam so that the traveling directions of the ion beam is parallelized. The beam parallelizing unit 34 may be replaced with another beam parallelizing device, and the beam parallelizing device may be configured to serve as a magnet device using a magnetic field.

An acceleration/deceleration (AD) column (not illustrated) for accelerating or decelerating the ion beam may be provided downstream of the beam parallelizing unit 34.

The angular energy filter (AEF) 36 is configured to analyze energy of the ion beam, to deflect ions having desired energy downward, and to guide the ions to the implantation processing chamber 16. The angular energy filter 36 has an AEF electrode pair for electric field deflection. The AEF electrode pair is connected to a high-voltage power supply (not illustrated). In FIG. 2, the ion beam is deflected downward by applying a positive voltage to the upper AEF electrode and applying a negative voltage to the lower AEF electrode. The angular energy filter 36 may be configured to include a magnet device for magnetic field deflection, or may be configured to include a combination between the AEF electrode pair for electric field deflection and the magnet device for magnetic field deflection.

In this way, the beamline unit 14 supplies the ion beam to be used for irradiating the wafer W to the implantation processing chamber 16.

The implantation processing chamber 16 includes an energy defining slit 38, a plasma shower device 40, side cups 42, a center cup 44, and a beam stopper 46, in order from the upstream side of the beamline A. As illustrated in FIG. 2, the implantation processing chamber 16 includes a platen driving device 50 that holds one or more wafers W.

The energy defining slit 38 is provided on the downstream side of the angular energy filter 36, and analyzes the energy of the ion beam incident into the wafer W together with the angular energy filter 36. The energy defining slit 38 is an energy defining slit (EDS) configured to include an opening that is horizontally long in the beam scanning direction (x-direction). The energy defining slit 38 causes the ion beam having a desired energy value or a desired energy range to pass toward the wafer W, and blocks the other ion beams.

The plasma shower device 40 is located on the downstream side of the energy defining slit 38. The plasma shower device 40 supplies low-energy electrons to the ion beam and a surface of the wafer W (wafer processing surface) in accordance with a beam current amount of the ion beam, and suppresses charge-up caused by an accumulation of positive charges on the wafer processing surface which are induced by ion implantation. For example, the plasma shower device 40 includes a shower tube through which the ion beam passes, and a plasma generating device that supplies electrons into the shower tube.

The side cups 42 (42R and 42L) are configured to measure the beam current of the ion beam during the ion implantation process into the wafer W. As illustrated in FIG. 2, the side cups 42R and 42L are disposed to be shifted to the right and left (x-direction) with respect to the wafer W disposed on the beamline A, and are disposed at positions where the side cups 42L and 42R do not block the ion beam directed toward the wafer W during the ion implantation. The ion beam is subject to scanning in the x-direction beyond a range where the wafer W is located. Accordingly, a portion of the beam for the scanning is incident into the side cups 42R and 42L even during the ion implantation. In this manner, the beam current amount during the ion implantation process is measured by the side cups 42R and 42L.

The center cup 44 is configured to measure the beam current on the wafer processing surface. The center cup 44 is configured to be movable in the x-direction by an operation of a drive unit 45, is retreated from an implantation position where the wafer W is located during the ion implantation, and is inserted into the implantation position when the wafer W is not located at the implantation position. The center cup 44 measures the beam current while moving in the x-direction. In this manner, the center cup 44 can measure the beam current over the whole beam scanning range in the x-direction. In the center cup 44, a plurality of Faraday cups may be aligned in the x-direction to be formed in an array shape so that the beam currents can be simultaneously measured at a plurality of positions in the beam scanning direction (x-direction).

At least one of the side cup 42 and the center cup 44 may include a single Faraday cup for measuring the beam current amount, or may include an angle measurement device for measuring angle information of the beam. For example, the angle measurement device includes a slit and a plurality of current detectors provided away from the slit in the beam traveling direction (z-direction). For example, the angle measurement device can measure an angle component of the beam in the slit width direction by causing the plurality of current detectors aligned in the slit width direction to measure the beams having passed through the slit. At least one of the side cups 42 and the center cup 44 may include a first angle measurement device capable of measuring angle information in the x-direction, and a second angle measurement device capable of measuring angle information in the y-direction.

The platen driving device 50 includes a wafer holding device 52, a reciprocating mechanism 54, a twist angle adjusting mechanism 56, and a tilt angle adjusting mechanism 58. The wafer holding device 52 includes an electrostatic chuck for holding the wafer W. The reciprocating mechanism 54 causes the wafer holding device 52 to reciprocate in a reciprocating direction (y-direction) perpendicular to the beam scanning direction (x-direction). In this manner, the wafer held by the wafer holding device 52 is caused to reciprocate in the reciprocating direction (y-direction). In FIG. 2, a reciprocating movement of the wafer W is indicated by an arrow Y.

The twist angle adjusting mechanism 56 adjusts a rotation angle of the wafer W. The twist angle adjusting mechanism 56 rotates the wafer W around a normal line of the wafer processing surface as a rotation center axis. In this manner, the twist angle adjusting mechanism 56 adjusts a twist angle between an alignment mark provided on an outer peripheral portion of the wafer and a reference position. Here, the alignment mark of the wafer means a notch or an orientation flat provided on the outer peripheral portion of the wafer, and means a mark that serves as a reference for a crystal axis direction of the wafer or an angular position in a circumferential direction of the wafer. The twist angle adjusting mechanism 56 is provided between the wafer holding device 52 and the reciprocating mechanism 54, and is caused to reciprocate together with the wafer holding device 52.

The tilt angle adjusting mechanism 58 adjusts tilting of the wafer W, and adjusts a tilt angle between the traveling direction of the ion beam directed toward the wafer processing surface and the normal line of the wafer processing surface. In the present embodiment, out of the tilt angles of the wafer W, an angle with respect to which the axis in the x-direction is a rotation center axis is adjusted as the tilt angle. The tilt angle adjusting mechanism 58 is provided between the reciprocating mechanism 54 and an inner wall of the implantation processing chamber 16, and rotates the whole platen driving device 50 including the reciprocating mechanism 54 in an R-direction. In this manner, the tilt angle adjusting mechanism 58 is configured to adjust the tilt angle of the wafer W.

The platen driving device 50 holds the wafer W so that the wafer W is movable between an implantation position where the wafer W is irradiated with the ion beam and a transfer position where the wafer W is loaded or unloaded between the platen driving device 50 and the wafer transfer device 18. FIG. 2 illustrates a state where the wafer W is located at the implantation position, and the platen driving device 50 holds the wafer W so that the beamline A and the wafer W intersect with each other. The transfer position of the wafer W corresponds to a position of the wafer holding device 52 when the wafer W is loaded or unloaded through a transfer port 48 by a transfer mechanism or a transfer robot provided in the wafer transfer device 18.

The beam stopper 46 is provided on the most downstream side of the beamline A, and is mounted on the inner wall of the implantation processing chamber 16, for example. When the wafer W does not exist on the beamline A, the ion beam is incident into the beam stopper 46. The beam stopper 46 is located close to the transfer port 48 that connects the implantation processing chamber 16 and the wafer transfer device 18 to each other, and is provided at a position vertically below the transfer port 48.

The ion implanter 10 further includes a control device 60. The control device 60 controls an overall operation of the ion implanter 10. The control device 60 is realized in hardware by elements such as a CPU and a memory of a computer or a mechanical device, and in software by a computer program or the like. Various functions provided by the control device 60 can be realized by cooperation between the hardware and the software.

The ion implanter 10 further includes a particle measurement device 62. The particle measurement device 62 is provided in at least one of the beamline unit 14 and the implantation processing chamber 16. The particle measurement device 62 is configured to measure particles passing through the beamline A or particles flying toward the wafer W. The particle measurement device 62 is configured to particularly measure the particles in a space through which the ion beam passes, and to measure the particles transported toward the wafer W together with the ion beam.

The particle measurement device 62 includes an illumination device 64 that performs irradiation with illumination light L, and an imaging device 66 that images a space through which the illumination light L passes. The illumination device 64 performs irradiation with the illumination light L toward the beamline A. The imaging device 66 images a space including the particles that scatter the illumination light L, and generates a captured image. The control device 60 acquires the captured image generated by the imaging device 66, and detects the particles, based on the captured image.

In the illustrated example, the particle measurement device 62 is configured to measure the particles passing through the angular energy filter 36. The illumination device 64 performs irradiation with the illumination light L toward a space between the plurality of AEF electrodes forming the angular energy filter 36. Irradiation with the illumination light L is performed in a direction intersecting with a transport direction (z-direction) of the ion beam, and the irradiation is performed to pass between the plurality of AEF electrodes (for example, between the AEF electrode on an upper side and the AEF electrode on a lower side). The imaging device 66 images at least a portion of a range irradiated with the illumination light L in the space between the plurality of AEF electrodes forming the angular energy filter 36. A field of view V of the imaging device 66 includes a space where the ion beam and the illumination light L intersect with each other.

The illumination device 64 is configured to generate the illumination light L which is visible light. The illumination device 64 is configured to generate the illumination light L which is continuous light instead of pulsed light, and to continuously illuminate a space which is a particle measurement target. The illumination device 64 may be configured to include a laser source, and to generate the illumination light L which is a red or green laser. The illumination device 64 may be configured to include an LED light source, and to generate the illumination light L which is not the laser.

The illumination device 64 is configured to generate the illumination light L having a sheet shape having a width in the x-direction, and to generate a laser light sheet, for example. The illumination device 64 may perform irradiation with the illumination light L having a sheet shape over the whole scanning range in the x-direction of the ion beam. The illumination device 64 may generate the illumination light L having a box shape having a width in the x-direction and a thickness in a direction perpendicular to the x-direction (for example, the y-direction or the z-direction). The illumination device 64 may be configured so that irradiation modes of the illumination light L can be switched therebetween, and for example, may be configured so that the illumination light having the sheet shape and the illumination light having the box shape can be switched therebetween.

The illumination device 64 is disposed to perform irradiation with the illumination light L toward the beamline A from a position away from the beamline A in the y-direction (on the upper side or the lower side). The illumination device 64 is disposed on the upstream side of the angular energy filter 36, for example, between the beam parallelizing unit 34 and the angular energy filter 36, and is disposed so that irradiation with the illumination light L is performed downward of the beamline A from the upper side of the beamline A. The illumination device 64 may be disposed to perform irradiation with the illumination light L toward the beamline A from a position away from the beamline in the x-direction (on the left side or the right side). For example, irradiation with the illumination light L is obliquely performed with respect to the beamline A. Irradiation with the illumination light L may be performed to be perpendicular to the beamline A.

The imaging device 66 has an image sensor such as CCD and CMOS sensors, and generates image data obtained by imaging a space which is a particle measurement target. The imaging device 66 is configured to generate a moving image by capturing a plurality of images at a predetermined frame rate (for example, 30 or 60 frames per second). The imaging device 66 may have a wavelength filter, or may have a bandpass filter through which the illumination light L which has the specific wavelength is selectively transmitted. Since only the wavelength of the illumination light L is an imaging target, it is possible to prevent the particles from being erroneously detected due to light different from the illumination light L.

The imaging device 66 is disposed so that an imaging direction of the imaging device 66 intersects with both an irradiating direction of the illumination light L and a transport direction of the ion beam. The imaging direction of the imaging device 66 may obliquely intersect with a plane formed by the illumination light L having the sheet shape, or may be perpendicular to the plane formed by the illumination light L having the sheet shape. The imaging device 66 is disposed to image at least a portion of the range irradiated with the illumination light L having the sheet shape from a position away from the plane formed by the illumination light L having the sheet shape. The imaging device 66 is disposed on a downstream side of the angular energy filter 36, for example, between the angular energy filter 36 and the energy defining slit 38, and is disposed to have a field of view V directed downward of the beamline A from the upper side of the beamline A. The illumination device 64 may be disposed to perform irradiation with the illumination light L toward the beamline A from a position away from the angular energy filter 36 in the x-direction (on the left side or the right side). The imaging device 66 may be disposed at a position away from the angular energy filter 36 in the x-direction (on the left side or the right side), and may be disposed to have the field of view V toward the beamline A in the +x-direction (from the left side to the right side) or −x-direction (from the right side to the left side).

The field of view V of the imaging device 66 includes at least a portion of the space in which the ion beam and the illumination light L intersect with each other. And it is preferable that the field of view V of the imaging device 66 includes the whole space in which the ion beam and the illumination light L intersect with each other. The field of view V of the imaging device 66 may include at least a portion of the scanning range in the x-direction of the ion beam, and may include the whole scanning range in the x-direction of the ion beam. The field of view V of the imaging device 66 may include at least a portion of the space between the plurality of AEF electrodes of the angular energy filter 36, and may include the whole range in the y-direction from the AEF electrode on the upper side to the AEF electrode on the lower side. The field of view V of the imaging device 66 may include a space in which the ion beam and the illumination light L do not intersect with each other.

The particle measurement device 62 may include a plurality of the imaging devices 66. The plurality of imaging devices 66 may be disposed to image the illumination light L having the sheet shape from different positions. The plurality of imaging devices 66 may be configured to function as a stereo camera, and may be capable of three-dimensionally identifying a position or a behavior of the particle by imaging the illumination light L having the sheet shape from the different positions. The plurality of imaging devices 66 may be disposed so that respective fields of view Vs overlap each other. The plurality of imaging devices 66 may be disposed so that respective fields of view Vs do not overlap each other, and each of the imaging devices 66 may be configured to image spaces including the particles at different positions or in different ranges.

The disposition of the illumination device 64 and imaging device 66 are not limited to the above-described disposition, and any desired suitable disposition can be adopted depending on a position or a range of a space which is a particle measurement target. The particle measurement device 62 may be disposed at any desired position in at least one of the beamline unit 14 and the implantation processing chamber 16. In the particle measurement device 62, the vicinity of the surface of the wafer W irradiated with the ion beam in the implantation processing chamber 16 may be adopted as the space which is the particle measurement target. For example, the illumination device 64 may be disposed to irradiate the vicinity of the surface of the wafer W with the illumination light L. The imaging device 66 may be disposed so that the field of view V of the imaging device 66 includes a range in which the vicinity of the surface of the wafer W is irradiated with the illumination light L.

Figure 3:
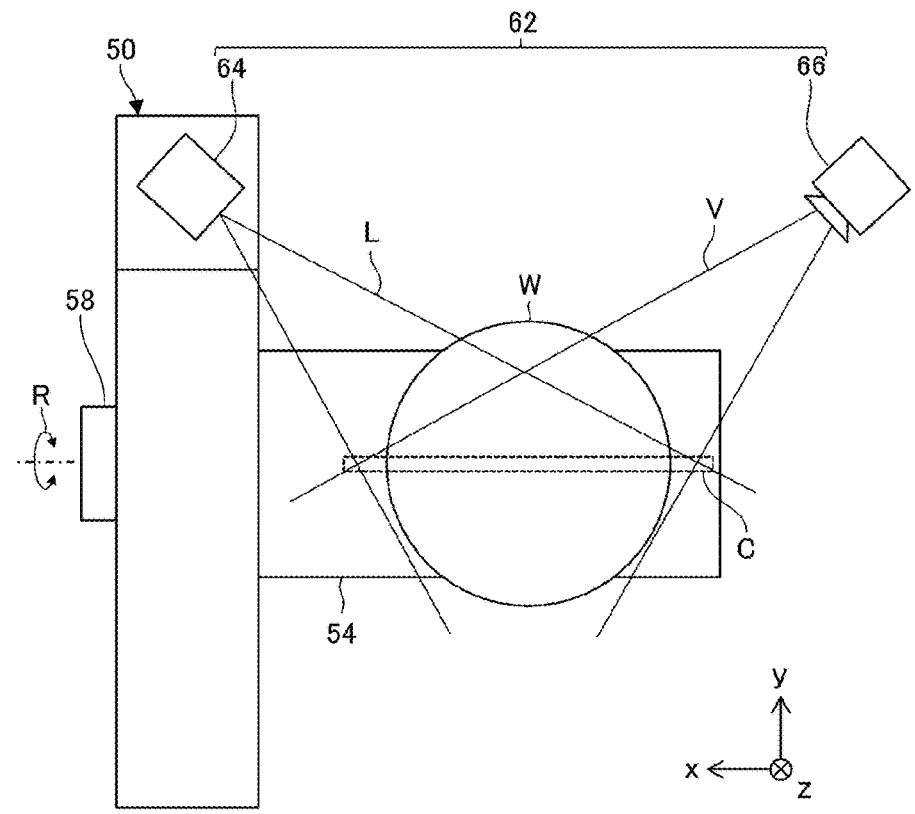
FIG. 3 is a front view schematically illustrating a disposition example of a particle measurement device whose measurement target is a vicinity of a surface of a wafer.
Figure 4:
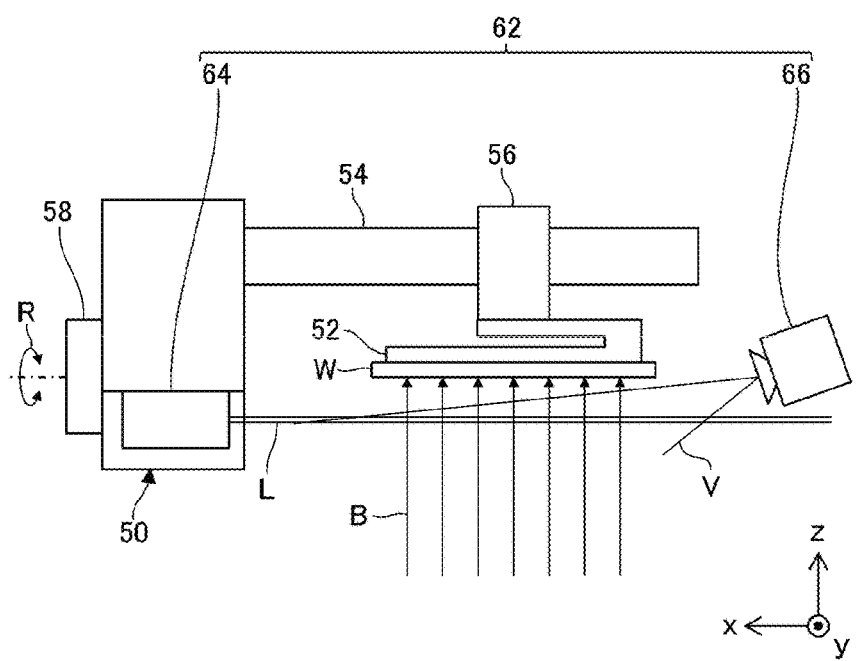
FIG. 4 is a top view schematically illustrating a disposition example of the particle measurement device whose measurement target is the vicinity of the surface of the wafer.

FIGS. 3 and 4 are views schematically illustrating a disposition example of the particle measurement device 62 whose measurement target is the vicinity of the surface of the wafer W. FIG. 3 is a front view when the surface of the wafer W is viewed in the z-direction, and FIG. 4 is a top view when the vicinity of the surface of the wafer W is viewed in the −y-direction from above. The illumination device 64 is disposed so that irradiation with the illumination light L having the sheet shape is performed along the surface of the wafer W to be parallel to the surface of the wafer W. Irradiation with the illumination light L may not strictly be parallel to the surface of the wafer W, and may be obliquely performed with respect to the surface of the wafer W. Irradiation with the illumination light L is performed toward a space within a predetermined range (for example, within 10 cm or within 1 m) from the surface of the wafer W. The illumination device 64 performs irradiation with the illumination light L so that the ion beam B incident into the wafer W and the illumination light L intersect with each other. In FIG. 3, an implantation region C in which the ion beam B is incident into the wafer W is illustrated by a dashed line frame.

The illumination device 64 is mounted on the platen driving device 50, and is configured to be rotatable together with the wafer W by the tilt angle adjusting mechanism 58 as illustrated by an arrow R. The illumination device 64 can adjust a passing region of the illumination light L in accordance with a tilt angle of the wafer W, and is configured so that an irradiation angle of the illumination light L is variable to follow a tilt angle of the wafer W when the tilt angle of the wafer W is changed. In the illustrated example, the illumination device 64 is disposed on an upper left side (side in the +x-direction and the +y-direction) of the wafer W. The illumination device 64 may be disposed on a lower left side (side in the +x-direction and the −y-direction) of the wafer W. The illumination device 64 may be disposed immediately on the left side (side in the +x-direction) of the wafer W, and positions of the wafer W and the illumination device 64 in the y-direction may coincide with each other. When the platen driving device 50 is disposed on the right side (side in the −x-direction) of the wafer W, the illumination device 64 may be also disposed on the right side (side in the −x-direction) of the wafer W. The illumination device 64 is disposed to avoid a movable range of the reciprocating mechanism 54. The illumination device 64 is disposed so as to avoid a position where the positions of the wafer W and the illumination device 64 in the x-direction coincide with each other, that is, to avoid a position directly above (side in the +y-direction) or directly below (side in the −y-direction) the wafer W.

The imaging device 66 is disposed so that a range where the illumination light L and the ion beam B intersect with each other is included in the field of view V. The imaging device 66 is disposed so that the surface of the wafer W is not included in the field of view V. In the illustrated example, the imaging device 66 is disposed to image the vicinity of the surface of the wafer W from the rear side (side in the +z-direction) of the wafer W. In the illustrated example, the imaging device 66 is disposed on the upper right side (side in the −x-direction and the +y-direction) of the wafer W. The imaging device 66 may be disposed on the lower right side (side in the −x-direction and the −y-direction) of the wafer W. The imaging device 66 may be disposed immediately on the right side (side in the −x-direction) of the wafer W, and the positions of the wafer W and the imaging device 66 in the y-direction may coincide with each other. The imaging device 66 is disposed to avoid the movable range of the reciprocating mechanism 54. The imaging device 66 is disposed to avoid a position where the positions of the wafer W and the imaging device 66 in the x-direction coincide with each other, that is, to avoid a position directly above (side in the +y-direction) or directly below (side in the −y-direction) of the wafer W. Since the surface of the wafer W is not included in the field of view V, it is possible to prevent the particles from being erroneously detected when a structure formed on the surface of the wafer W is imaged.

In the example illustrated in FIGS. 3 and 4, the imaging device 66 is not mounted on the platen driving device 50, and is configured so that the field of view V is not changed in accordance with the tilt angle of the wafer W. The imaging device 66 may be configured so that the field of view V can be adjusted in accordance with the tilt angle of the wafer W.

Figure 5:
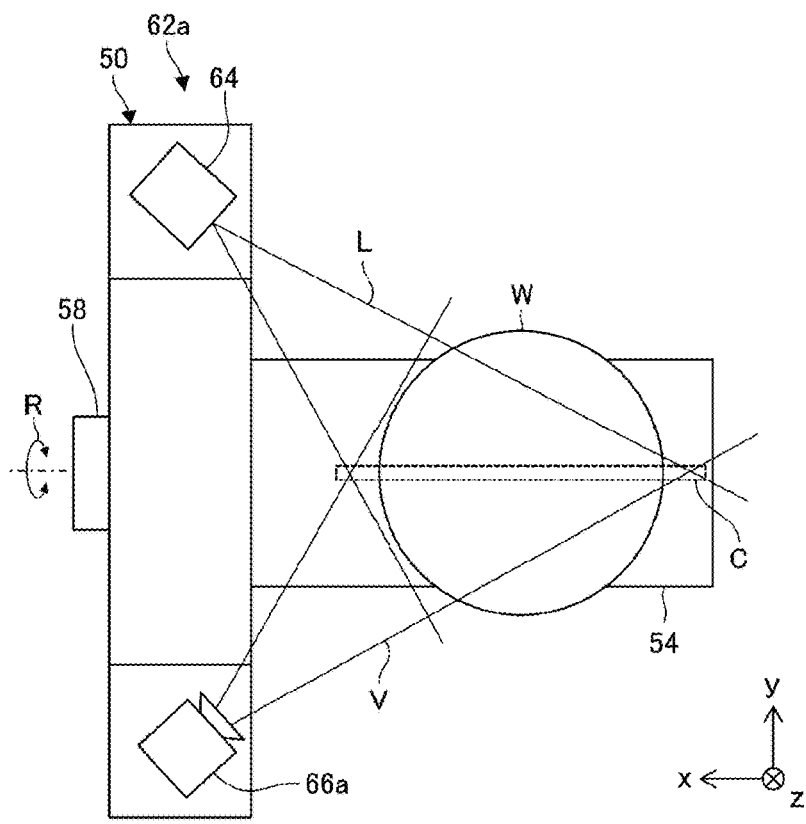
FIG. 5 is a front view schematically illustrating a modified disposition example of a particle measurement device whose measurement target is the vicinity of the surface of the wafer.
Figure 6:
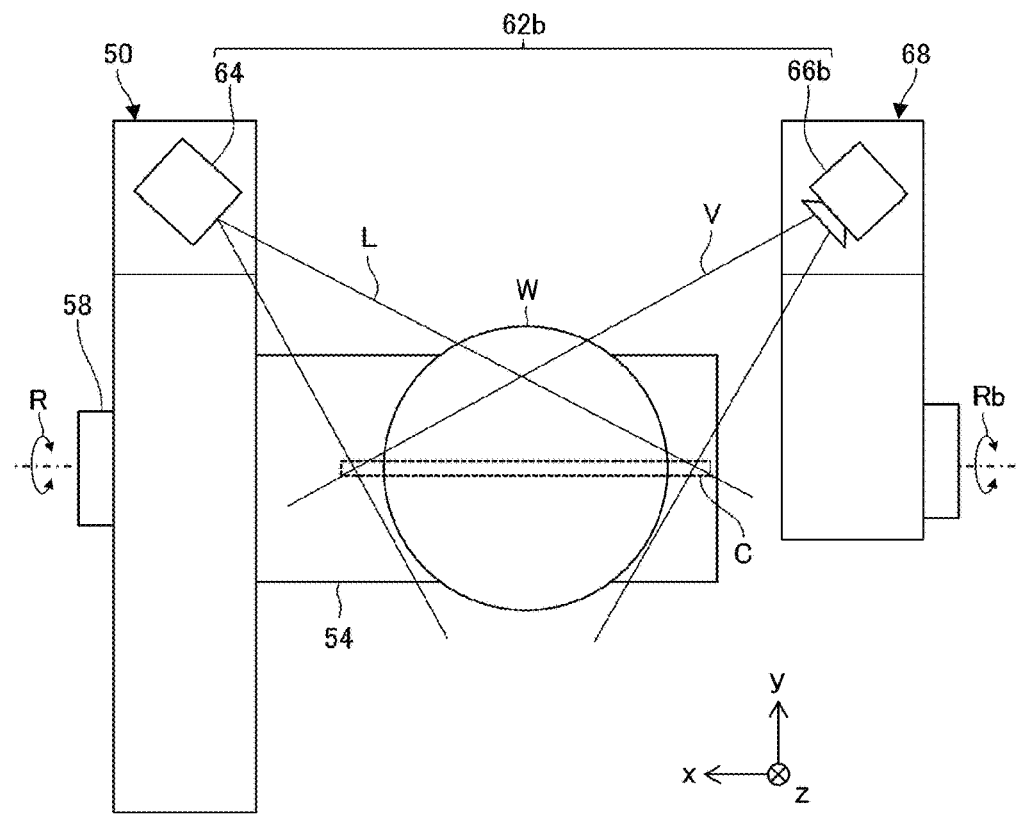
FIG. 6 is a front view schematically illustrating another modified disposition example of a particle measurement device whose measurement target is the vicinity of the surface of the wafer.

Each of FIGS. 5 and 6 is a front view schematically illustrating a modified disposition example of a particle measurement device whose measurement target is the vicinity of the surface of the wafer. In a particle measurement device 62a illustrated in FIG. 5, an imaging device 66a is mounted on the platen driving device 50 as the illumination device 64. In a particle measurement device 62b illustrated in FIG. 6, an imaging device 66b is mounted on a drive mechanism 68 by which the field of view V is variable in accordance with the tilt angle of the wafer W. The drive mechanism 68 is mounted on an inner wall of the implantation processing chamber 16, and is configured to be rotatable as illustrated by an arrow Rb. For example, the drive mechanism 68 is configured to be driven in conjunction with the rotation of the tilt angle adjusting mechanism 58 illustrated by the arrow R. The drive mechanism 68 may be driven when it is necessary to measure the particles in the vicinity of the wafer surface.

The ion implanter 10 may include a plurality of the particle measurement devices 62. Each of the plurality of particle measurement devices 62 may set different positions or different ranges of the beamline A as measurement target spaces. For example, a first particle measurement device may be provided in the beamline unit 14, and a second particle measurement device may be provided in the implantation processing chamber 16. Since the plurality of particle measurement devices 62 are provided, it is possible to measure the particles at a plurality of positions or in a plurality of ranges of the beamline A. For example, the measurement results of the particles at the plurality of positions or in the plurality of ranges are compared with each other. In this manner, the comparison can be useful for identifying a generation source of the particles.

A portion of the particle measurement device 62 may be provided outside the vacuum chamber forming the beamline unit 14 and the implantation processing chamber 16. For example, a vacuum window may be provided on a wall of the vacuum chamber, and irradiation with the illumination light L may be performed through the vacuum window. Alternatively, an irradiation range of the illumination light L may be imaged through the vacuum window. An easily replaceable cover member such as a resin film may be added to the vacuum window. In this manner, a countermeasure may be taken against stains caused by adhesion of the particles or reflection of the ion beam. In addition, when the cover member is dirty, a configuration may be adopted so that the cover member can be switched to another cover member while a vacuum state of the apparatus is maintained. In this manner, even when the cover member is dirty, it may be unnecessary to carry out replacement work of the window member or the cover member where the apparatus needs to be exposed to the atmosphere.

The particle measurement device 62 may include an additional optical element such as a mirrors or a lenses for performing irradiation with the illumination light L, or may include an additional optical elements such as a mirrors or a lenses for imaging an irradiation range of the illumination light L. A configuration may be adopted so that a position or an orientation of the optical element is variable. In this manner, a position or a range of a space which is a particle measurement target may be variable. For example, a configuration may be adopted so that the position or the orientation of the optical elements may be variable in accordance with the tilt angle of the wafer W.

Figure 7:
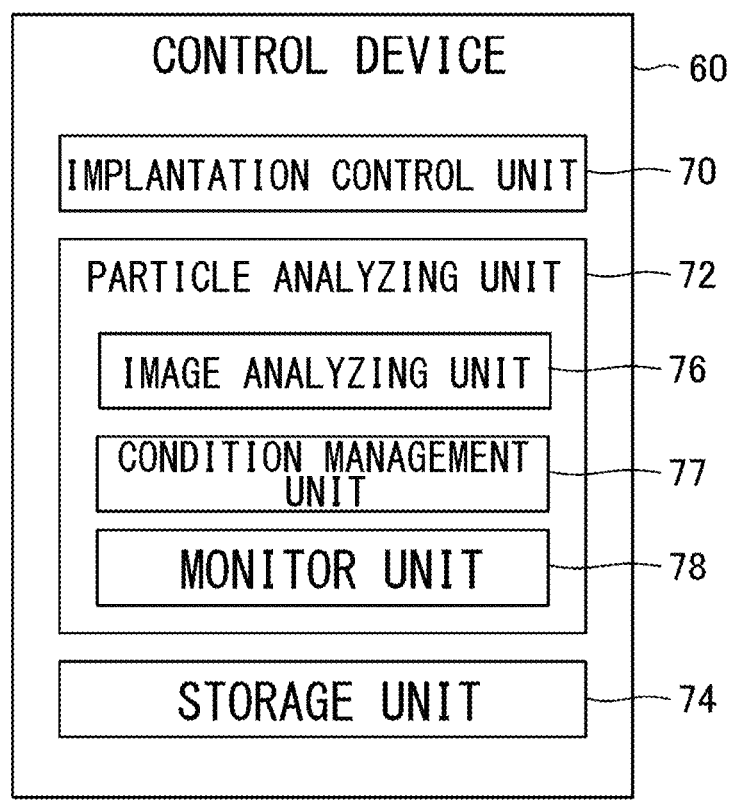
FIG. 7 is a view schematically illustrating a functional configuration of a control device according to the embodiment.

FIG. 7 is a functional block diagram schematically illustrating a functional configuration of the control device 60 according to the embodiment. The control device 60 includes an implantation control unit 70, a particle analyzing unit 72, and a storage unit 74. The implantation control unit 70 controls an operation of the ion implanter 10, based on an implantation recipe. The particle analyzing unit 72 controls an operation of the illumination device 64, and detects the particles in the measurement target space, based on a captured image generated by the imaging device 66. The storage unit 74 stores various data required for an operation of the control device 60.

The implantation control unit 70 reads the implantation recipe stored in the storage unit 74, and generates the ion beam, based on the implantation recipe. In the implantation recipe, a set of implantation parameters such as ion species, beam energy, a beam current, a beam size, a wafer tilt angle, a wafer twist angle, and an average dose is determined. In the implantation recipe, the implantation parameter for performing non-uniform implantation may be determined. In the implantation recipe, a two-dimensional dose distribution for the non-uniform implantation may be determined, or a correction file for variably controlling a beam scan speed or a wafer movement speed may be specified.

The implantation control unit 70 adjusts operation parameters of various devices configuring the ion implanter 10 so that desired implantation parameters determined in the acquired implantation recipe are realized. The implantation control unit 70 controls the ion species of the ion beam by adjusting a gas type, an extraction voltage of the ion generation device 12, the magnetic field intensity of the mass analyzing unit 20, and so on. The implantation control unit 70 controls the beam energy of the ion beam by adjusting the extraction voltage of the ion generation device 12, an applied voltage of the beam parallelizing unit 34, an applied voltage of an AD column, or an applied voltage of the angular energy filter 36, and so on. The implantation control unit 70 controls the beam current of the ion beam by adjusting various parameters such as a gas amount, an arc current, an arc voltage, and an ion source magnet current of the ion generation device 12, an opening width of the mass resolving aperture 23, and so on. The implantation control unit 70 controls the beam size of the ion beam incident into the wafer processing surface by adjusting an operation parameter of a focusing/defocusing device included in the beam shaping unit 30 and so on. The implantation control unit 70 operates the twist angle adjusting mechanism 56 and the tilt angle adjusting mechanism 58 so that a desired wafer tilt angle and a desired wafer twist angle are realized. The implantation control unit 70 controls an operation of the vacuum exhaust system so that the internal pressures (vacuum degrees) of the beamline unit 14 and the implantation processing chamber 16 have desired values. The implantation control unit 70 operates the wafer transfer device 18 to control loading and unloading of the wafer W.

The implantation control unit 70 controls the average dose and the dose distribution to be implanted into the wafer W in the implantation process. When the non-uniform implantation is performed, the implantation control unit 70 variably controls the beam scan speed and the wafer movement speed, based on the acquired implantation recipe. The implantation control unit 70 variably controls the beam scan speed by controlling a scanning voltage parameter commanded to the beam scanning unit 32, and variably controls the wafer movement speed by controlling a speed parameter commanded to the reciprocating mechanism 54. The implantation control unit 70 decreases a time change rate dV/dt of the scanning voltage so that the beam scan speed becomes slower at a location where the dose is to be relatively high, and increases the time change rate dV/dt of the scanning voltage so that the beam scan speed becomes faster at a location where the dose is to be relatively low. The implantation control unit 70 makes the wafer movement speed slower at the location where the dose is to be relatively high, and makes the wafer movement speed faster at the location where the dose is to be relatively low.

The particle analyzing unit 72 includes an image analyzing unit 76, a condition management unit 77, and a monitor unit 78. The image analyzing unit 76 detects the particles, based on the captured image generated by the imaging device 66, and analyzes the amount, the traveling speed, or the size of the particles. The condition management unit 77 manages particle analyzing conditions used by the image analyzing unit 76. The monitor unit 78 monitors a particle generation status and diagnoses the presence or absence of abnormality.

The image analyzing unit 76 acquires image data captured by the imaging device 66, and detects the particles, based on a brightness value of each pixel of the image data. For example, the image analyzing unit 76 determines that pixels having the brightness value exceeding a predetermined threshold value include the particles, and determines that pixels having the brightness value smaller than the predetermined threshold value do not include the particles. The image analyzing unit 76 may detect the particles, based on a temporal change amount in the brightness value. The image analyzing unit 76 may generate a difference image obtained by subtracting a background image where the particles are not included from the captured image generated by the imaging device 66, and may detect the particles, based on the brightness value of the difference image. For example, the background image where the particles are not included is generated, based on the captured image generated by the imaging device 66, and is stored in the storage unit 74.

The image analyzing unit 76 may detect the particles for each minute region included in the captured image, instead of detecting the particles for each pixel of the captured image. The minute region which is a detection unit of the particles is set to include a plurality of pixels, and is set to include 5×5 pixels, for example. The image analyzing unit 76 divides the captured image into a plurality of minute regions, and calculates a total value or an average value of the brightness for each minute region by summing or averaging the brightness values of the plurality of pixels forming the minute region. For example, when the total value or the average value of the brightness for each minute region exceeds a predetermined threshold value, the image analyzing unit 76 determines that the minute region includes the particles. The image analyzing unit 76 may divide the difference image obtained by subtracting the background image from the captured image into the plurality of minute regions, and may detect the particles, based on the total value or the average value of the brightness for each minute region in the difference image. Since the particles are detected based on the sum or the average of the brightness values of the plurality of pixels in the minute region, scattered light from the particles can be detected after integration, and accuracy in detecting the particles can be improved.

The image analyzing unit 76 may have a different particle detection threshold value for each pixel or each minute region. The image analyzing unit 76 may calculate the threshold value for each pixel or each minute region, based on a plurality of the background images captured when the particles are not included. For example, the plurality of background images are captured at different timings by the imaging device 66, and have such fluctuations that the brightness value slightly fluctuates with the lapse of time. The image analyzing unit 76 calculates an average a and a standard deviation $\sigma$ of the brightness values in the plurality of background images for a specific pixel or a specific minute region, and determines the threshold value by using the average a and the standard deviation $\sigma$. For example, the brightness value obtained by adding k times the standard deviation $\sigma$ to the average a may be set as a threshold value t, or may be expressed as $t=a+k\sigma$. Since the threshold value t is determined based on the average a and the standard deviation $\sigma$ of the brightness values in the plurality of background images, it is possible to prevent the particles from being erroneously detected due to a change in the brightness value which does not relate to generation of the particles. For example, the threshold value t can be determined, based on the average a and the standard deviation $\sigma$ in approximately 50 to 100 background images.

The image analyzing unit 76 may detect the particles when the brightness values of the plurality of minute regions adjacent to each other exceed a predetermined threshold value, instead of individually detecting the particles for each minute region. The image analyzing unit 76 determines the minute region whose brightness value exceeds the predetermined threshold value, as a "candidate region" having a possibility that the particles may be included. When a predetermined number or more of other candidate regions exist around the candidate region, the image analyzing unit 76 determines that the particles are included in the candidate region. When the number of other candidate regions existing around the candidate region is smaller than the predetermined number, the image analyzing unit 76 determines that the particles are not included in the candidate region. For example, when three or more candidate regions exist in a determination range which is a cluster of 5×5 minute regions around the candidate region, the three or more candidate regions included in the determination range are determined as particle detection regions. On the other hand, when two or less candidate regions exist in the determination range which is a cluster of 5×5 minute regions around the candidate region, the two or less candidate regions included in the determination range are determined to remain as the candidate regions without being determined as the particle detection regions.

Figure 8:
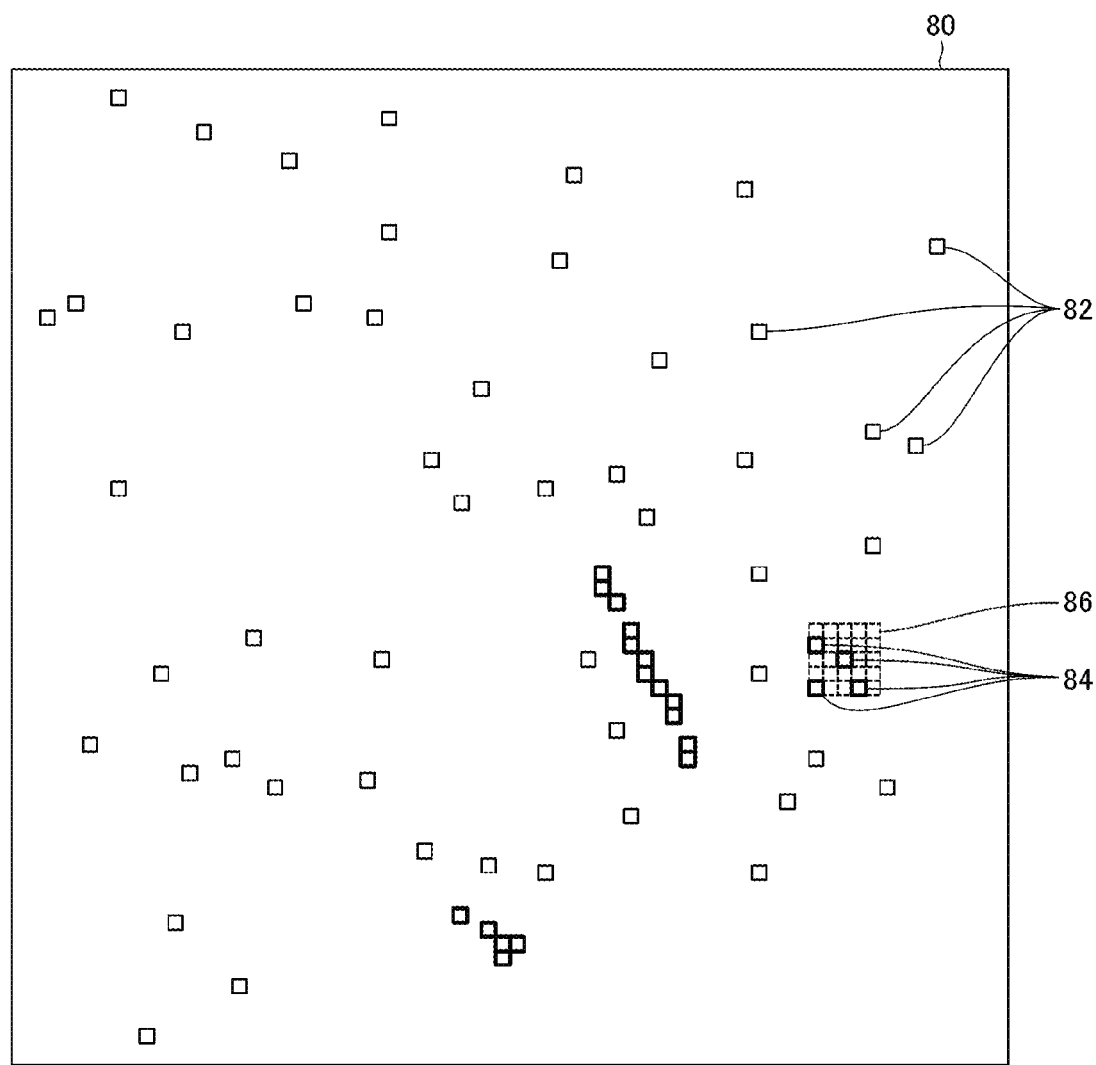
FIG. 8 is a view schematically illustrating a particle detection region.

FIG. 8 is a view schematically illustrating particle detection regions 84, and illustrates an example of a distribution of candidate regions 82 and the particle detection regions 84 which are identified based on a captured image 80. In FIG. 8, the candidate regions 82 are illustrated by thin solid line frames, the particle detection regions 84 are illustrated by thick solid line frames, and a determination range 86 which is the cluster of 5×5 minute regions is illustrated by a dashed line. As illustrated, the candidate region 82 is distributed throughout the whole captured image 80. Many candidate regions 82 sporadically exist away from the other candidate regions 82. Some candidate regions 82 densely exist closer to the other candidate regions 82. The image analyzing unit 76 determines the densely existing candidate regions 82 as the particle detection regions 84. Specifically, when three or more candidate regions 82 exist in the determination range 86 which is the cluster of 5×5 minute regions around a certain candidate region 82, the three or more candidate regions 82 are all determined as the particle detection regions 84. In an example illustrated in FIG. 8, 21 particle detection regions 84 are detected.

As illustrated in FIG. 8, since the densely existing candidate regions 82 are determined as the particle detection regions 84, it is possible to prevent the particles from being erroneously detected due to a change in the brightness value which does not relate to generation of the particles. The particles generated inside the beamline unit 14 or the implantation processing chamber 16 often fly at a traveling speed instead of floating without changing the positions. When a space including the moving particles is imaged by the imaging device 66, flight trajectories of the particles are imaged, and the brightness values of the plurality of regions corresponding to the flight trajectories increase. The plurality of regions corresponding to the flight trajectories of the particles exist adjacent to each other. Accordingly, the flying particles can be accurately detected by determining that the densely existing candidate regions 82 are the detection targets of the particles as the particle detection regions 84.

The image analyzing unit 76 may estimate the amount, the traveling speed, or the size of the particles, based on a detection result of the particles. The image analyzing unit 76 may estimate the amount of particles, based on the number of pixels or minute regions where the particles are detected. The image analyzing unit 76 may estimate that the number of pixels or minute regions where particles are detected is the number of the particles. The number of the particles may be measured in advance by using another device different from the particle measurement device 62, and a correlation between the number of pixels or minute regions where the particles are detected and the number of the particles which is measured in advance may be stored in the storage unit 74. The another device may measure the number of the particles on the wafer W in advance. The image analyzing unit 76 may estimate the number of the particles, based on the correlation stored in the storage unit 74. The image analyzing unit 76 may estimate the number of the particles that can reach the surface of the wafer W, based on the correlation stored in the storage unit 74.

The image analyzing unit 76 may estimate the traveling speed of the particle by analyzing a behavior of the particle. For example, the traveling speed of the particle may be estimated, based on a range of the plurality of particle detection regions 84 corresponding to the flight trajectory of the particle. For example, the traveling speed of the particle may be estimated by dividing a length of the series of the plurality of particle detection regions 84 by a time corresponding to an imaging cycle of the imaging device 66. The image analyzing unit 76 may identify the flight trajectory of the particle, and may estimate the traveling speed of the particle by comparing a plurality of frames in the stack of the captured images 80 with each other. For example, the amount of movement of the particle may be estimated by comparing two temporally sequential frames in the stack of the captured images 80 with each other and identifying a change between respective positions of the particle detection regions 84 of the two frames in the captured image 80, and the traveling speed of the particle may be estimated by dividing the estimated amount of movement by the time corresponding to the imaging cycle of the imaging device 66. The image analyzing unit 76 may analyze the behavior of the particle by using the plurality of captured images 80 generated by the plurality of imaging devices 66 such as a stereo camera, and may estimate the traveling speed of the particle.

The image analyzing unit 76 may estimate the size of the particle, based on the brightness value of the particle detection region 84. Scattered light intensity of the particle depends on the size (particle diameter) of the particle. Accordingly, a correlation between the sizes of the particles and the scattered light intensities is measured in advance, and the correlation is stored in the storage unit 74. In this manner, the size of the particle can be estimated from the scattered light intensity (that is, the brightness value). The image analyzing unit 76 may estimate the size of the particle, based on an electric field E acting on the particle between a plurality of electrodes and acceleration $\alpha$ of the particle.

The condition management unit 77 accumulates the captured images generated by the imaging device 66 in the storage unit 74, and determines particle detection condition used by the image analyzing unit 76, based on the stored captured images. The condition management unit 77 accumulates the captured images determined by the image analyzing unit 76 that the particles are not included, as the background images. The condition management unit 77 calculates the average a and the standard deviation $\sigma$ for each pixel or each minute region in the plurality of background images, based on the accumulated background images, and determines the threshold value t for detecting the particles. The condition management unit 77 may update the threshold value t, based on the newly acquired background image. The background image may be changed with the lapse of time, depending on an operation of the ion implanter 10. Therefore, by updating the threshold value t based on the newly acquired background image, the particles can accurately be detected, based on a difference from the background image at any desired time point.

The condition management unit 77 may change the particle detection condition in accordance with an operation state of the ion implanter 10. The condition management unit 77 may store a plurality of particle detection conditions in the storage unit 74, and may change the particle detection condition in accordance with the operation state of the ion implanter 10. The condition management unit 77 may classify and store the background images in accordance with the operation states of the ion implanter 10, and may determine the particle detection condition such as the threshold value t, based on the plurality of background images corresponding to a specific operation state. A magnification k of the standard deviation $\sigma$ used for the threshold value t may be switched in accordance with the operation state of the ion implanter 10.

The condition management unit 77 may change the particle detection condition in accordance with the beam current amount of the ion beam. When the beam current amount of the ion beam is large, in some cases, a light emission amount may increase in the light emission phenomenon caused by the interaction between the residual gas inside the vacuum chamber and the ion beam, and brightness values in all or some regions of the background images may increase. Therefore, the background images used for detecting the particles may be switched in accordance with the beam current amount of the ion beam. Since the background image is switched in accordance with the light emission amount in the above-described light emission phenomenon, it is possible to prevent the particles from being erroneously detected due to the light emission phenomenon.

The condition management unit 77 may change the particle detection condition in accordance with a transport state of the ion beam to be transported. The condition management unit 77 may switch the particle detection condition in accordance with whether the ion beam is in an unscanned state where reciprocal scanning is not performed by the beam scanning unit 32, or whether the ion beam is in a scanned state where the reciprocal scanning is performed by the beam scanning unit 32. The condition management unit 77 may switch the particle detection condition in accordance with whether or not the ion beam is intermediately blocked by the beam park device 24 or the injector Faraday cup 28. An influence range of the above-described light emission phenomenon varies depending on a transport state of the ion beam. Accordingly, the background image is switched in accordance with the transport state of the ion beam. In this manner, it is possible to prevent the particles from being erroneously detected due to the light emission phenomenon.

The condition management unit 77 may change the particle detection condition in accordance with a change in the internal pressure of at least one of the beamline unit 14 and the implantation processing chamber 16. When the vacuum exhaust system is operated, the gas is introduced into the device, or the wafer W is transferred, the gas flows in the beamline unit 14 or the implantation processing chamber 16. In some cases, the particles may scatter along with the gas flow, or a scattering amount of the particles may increase. In addition, when the gas is introduced into the beamline unit 14 or the implantation processing chamber 16, in some cases, the light emission amount in the light emission phenomenon caused by the interaction between the introduced gas and the ion beam may be changed. The particle detection condition is switched in accordance with the change in the pressure. In this manner, the particles can be more properly detected.

The condition management unit 77 may change the particle detection condition in accordance with a magnitude of the electric field applied to the ion beam. For example, the particle detection condition may be switched in accordance with voltage values applied to a plurality of electrodes of the AD column, the beam parallelizing unit 34, and the angular energy filter 36. When the electric field applied to the ion beam is large, in some cases, the electric field may accelerate the particles, or discharge generated between the electrodes may cause the particles to scatter, thereby affecting the behavior of the particles. The particle detection condition is switched in accordance with the voltage value applied to the plurality of electrodes. In this manner, the particles can be more properly detected.

The condition management unit 77 may change the particle detection condition by switching the operation of the illumination device 64. The condition management unit 77 may cause the illumination device 64 to perform irradiation with the illumination light L having the sheet shape, when the amount of the actually measured particles is large, or when the operation state is expected to provide a condition where the amount of the particles is likely to increase. The irradiation range is limited by using the illumination light L having the sheet shape. In this manner, it is possible to limit the number of pixels or minute regions having high brightness in the captured image, and the particles can be more properly detected. The condition management unit 77 may cause the illumination device 64 to perform irradiation with the illumination light L having the box shape, when the amount of the actually measured particles is small, or when the operation state is expected to provide a condition where the amount of the particles is likely to decrease. The irradiation range is extended by using the illumination light L having the box shape. In this manner, a wider range can be measured, and the particles can be more properly detected.

The monitor unit 78 causes the storage unit 74 to store the particle generation status such as the presence or absence, the amount, the traveling speed, and the size of particle analyzed by the image analyzing unit 76, monitors a temporal change in the particle generation status, and diagnoses whether or not there is any abnormality in a state of the ion implanter 10. For example, when the amount of the particles suddenly increases, the monitor unit 78 may determine that there is an abnormality in the state of the ion implanter 10 to stop the implantation process or to output an alert. The monitor unit 78 may prompt a user to perform maintenance on the ion implanter 10, when the amount of the particles monotonously increases with the lapse of time and exceeds a predetermined threshold value. The monitor unit 78 may diagnose whether or not a state of the ion implanter 10 enables the implantation process to be performed, based on the particle generation status analyzed after the maintenance is performed on the ion implanter 10. The monitor unit 78 may prompt the user to perform a cleaning process on the beamline of the ion implanter 10, based on a diagnosis result.

The monitor unit 78 may diagnose the particle generation status for each implantation recipe. The monitor unit 78 may cause the storage unit 74 to store the particle generation status for each implantation recipe, and may individually set a threshold value for determining that there is the abnormality in the state of the ion implanter 10 in accordance with the implantation recipe. The monitor unit 78 may diagnose the particle generation status at any desired time point, based on the past particle generation status in a case where the same implantation recipe was used, when the implantation process is performed according to a specific implantation recipe.

The monitor unit 78 may analyze the particle generation status which is stored in the storage unit 74 for each implantation recipe, and may extract an implantation condition in which the particles are likely to be generated. For example, as the implantation condition in which the particles are likely to be generated, the implantation condition such as the ion species, the beam energy, the beam current, the beam size, and the electrode voltage may be extracted and displayed. In addition, in a case where the implantation condition or the implantation recipe in which the particles are likely to be generated is identified, an alert may be output when the implantation process needs to be performed by using the identified implantation condition or the identified implantation recipe.

The monitor unit 78 may estimate a generation source of the particles, based on the behavior of the particles analyzed by the image analyzing unit 76. For example, when the amount of the particles traveling in a specific direction is large, the monitor unit 78 may estimate that the generation source of the particles is present on the upstream side in the traveling direction of the particles. When the plurality of particle measurement devices 62 are provided corresponding to different positions of the beamline A, the monitor unit 78 may estimate the generation source of the particles, based on the particle generation status at each position. For example, when the amount of the particles increases on the downstream side of the beamline A just after the amount of the particles increases on the upstream side of the beamline A.

Hitherto, the present invention has been described with reference to the above-described respective embodiments. However, the present invention is not limited to the above-described respective embodiments. Those in which configurations of the respective embodiments are appropriately combined or replaced with each other are also included in the present invention. Based on the knowledge of those skilled in the art, the respective embodiments can be combined with each other, the processing sequences can be appropriately rearranged, or various modifications such as design changes can be added to the embodiment. The embodiment having the added modifications can also be included in the scope of the present invention.

It should be understood that the invention is not limited to the above-described embodiment, but may be modified into various forms on the basis of the spirit of the invention. Additionally, the modifications are included in the scope of the invention.

What is claimed is:

1. An ion implanter comprising:
    a beamline unit that transports an ion beam;
    an implantation processing chamber in which implantation processing is performed to irradiate a wafer with the ion beam;
    an illumination device that performs irradiation with illumination light in a direction intersecting with a transport direction of the ion beam in at least one of the beamline unit and the implantation processing chamber;
    an imaging device that generates a captured image captured by imaging a space through which the illumination light passes; and
    a control device that detects a particle which scatters the illumination light, based on the captured image.

2. The ion implanter according to claim 1,
    wherein the control device changes a detection condition of the particle in response to an operation state of the beamline unit.

3. The ion implanter according to claim 1,
    wherein the control device changes a detection condition of the particle in response to a beam current of the ion beam.

4. The ion implanter according to claim 1,
    wherein the control device changes a detection condition of the particle in response to a transport state of the ion beam in the beamline unit.

5. The ion implanter according to claim 1,
    wherein the control device changes a detection condition of the particle in response to a change in an internal pressure of at least one of the beamline unit and the implantation processing chamber.

6. The ion implanter according to claim 1,
    wherein the beamline unit includes a plurality of electrodes for applying an electric field to the ion beam,
    irradiation with the illumination light is performed so that the illumination light passes between the plurality of electrodes, and the imaging device images a space between the plurality of electrodes.

7. The ion implanter according to claim 6, wherein the control device changes a detection condition of the particle in response to a voltage value applied to the plurality of electrodes.

8. The ion implanter according to claim 1, wherein a vicinity of a surface of the wafer is irradiated with the illumination light, and the imaging device is disposed so that a field of view of the imaging device does not include the surface of the wafer.

9. The ion implanter according to claim 1, wherein the implantation processing chamber includes atilt angle adjustment mechanism for adjusting a tilt angle of the wafer with respect to the transport direction of the ion beam, the illumination device is configured so that a passing region of the illumination light is adjustable in response to the tilt angle of the wafer, and the imaging device is configured so that a field of view of the imaging device is adjustable in response to the tilt angle of the wafer.

10. The ion implanter according to claim 1, wherein irradiation with the illumination light is performed in a sheet shape or a box shape so that the illumination light intersects with the ion beam.

11. The ion implanter according to claim 1, wherein irradiation with the illumination light is performed continuously in time, and the imaging device generates a plurality of captured images captured at different timings.

12. The ion implanter according to claim 1, wherein the control device divides the captured image into a plurality of minute regions, calculates a brightness value of each of the plurality of minute regions by summing or averaging brightness values of a plurality of pixels included in each of the plurality of minute regions, and detects presence or absence of the particle for each of the plurality of minute regions, based on the brightness value of each of the plurality of minute regions.

13. The ion implanter according to claim 12, wherein the control device specifies the minute region having the brightness value exceeding a threshold value, and detects the presence or absence of the particle for each of the minute regions, based on a distribution of the specified minute regions in the captured image.

14. The ion implanter according to claim 12, wherein the control device detects the presence or absence of the particle for each of the minute regions according to a detection condition of the particle which is determined for each of the minute regions.

15. The ion implanter according to claim 14, wherein the control device determines the detection condition of the particle for each of the minute regions, based on an average and a standard deviation of the brightness values of the minute regions in a plurality of captured images captured at different timings by the imaging device.

16. The ion implanter according to claim 12, wherein the control device estimates an amount of the particles existing in the space imaged by the imaging device, based on a detection result of the presence or absence of the particle for each of the minute regions.

17. The ion implanter according to claim 1, wherein the control device determines the detection condition of the particle which is adopted in a case where the beamline unit is in a specific operation state, based on a plurality of captured images captured at different timings by the imaging device in the case where the beamline unit is in the specific operation state.

18. The ion implanter according to claim 1, wherein the control device determines whether or not the captured image includes the particle, and updates the detection condition of the particle, based on the captured image for which it is determined that the particle is not included.

19. The ion implanter according to claim 1, wherein the control device analyzes a behavior of the particle, based on the captured image, and estimates a size of the particle, based on an analysis result of the behavior of the particle.

20. A particle detection method comprising:
performing irradiation with illumination light in a direction intersecting with a transport direction of an ion beam,
generating a captured image captured by imaging a space through which the illumination light passes, and
detecting a particle which scatters the illumination light, based on the captured image.

* * * * *